United States Patent
Micheloni et al.

[19]

[11] Patent Number: 6,144,589
[45] Date of Patent: Nov. 7, 2000

[54] BOOSTING CIRCUIT, PARTICULARLY FOR A MEMORY DEVICE

[75] Inventors: Rino Micheloni, Turate; Giovanni Campardo, Bergamo; Donato Ferrario, Carugate; Carla Maria Golla, Sesto San Giovanni, all of Italy

[73] Assignee: STMicroelecronics S.r.l., Agrate Brianza, Italy

[21] Appl. No.: 09/186,758

[22] Filed: Nov. 5, 1998

[30] Foreign Application Priority Data

Nov. 5, 1997 [EP] European Pat. Off. ............ 978305572

[51] Int. Cl.[7] ................................................... G11C 7/00
[52] U.S. Cl. ................... 365/189.11; 365/185.23; 327/589
[58] Field of Search .................... 365/189.11, 185.23; 327/390, 589

[56] References Cited

U.S. PATENT DOCUMENTS

| | | | |
|---|---|---|---|
| 4,769,792 | 9/1988 | Nogami et al. | 365/222 |
| 5,537,362 | 7/1996 | Gill et al. | 365/233.5 |
| 5,612,924 | 3/1997 | Miyamoto | 365/233.5 |
| 5,644,534 | 7/1997 | Soejima | 365/185.23 |

*Primary Examiner*—David Nelms
*Assistant Examiner*—Hoai V. Ho
*Attorney, Agent, or Firm*—Theodore E. Galanthay; E. Russell Tarleton; Seed IP Law Group PLLC

[57] ABSTRACT

A boosting circuit supplied by a first voltage level and a second voltage level, and having an output line capable of taking a third voltage level, the circuit having at least two distinct circuits for generating the third voltage level, the at least two circuits selectively activatable for generating the third voltage level and selectively coupleable to the output line.

26 Claims, 4 Drawing Sheets

BOOSTING CIRCUIT, PARTICULARLY FOR A MEMORY DEVICE

TECHNICAL FIELD

The present invention relates to an improved boosting circuit, particularly for the use in a non-volatile memory, such as for example a ROM, an EPROM, a Flash EEPROM or an EEPROM, during read operations, or generally during operations involving the access to single memory locations.

BACKGROUND OF THE INVENTION

It is known that non-volatile memory devices comprise a matrix of memory cells arranged in rows and columns. Reading of electrically erasable and programmable ROMs involves applying to the selected row, and thus to the gate electrode of the memory location or memory cell to be read, a voltage usually equal to the supply voltage of the memory device, and detecting the current flowing through the memory cell. In the case of a "written" cell, the threshold voltage thereof is approximately 5 V, or however higher than the voltage applied to its gate electrode; consequently, during reading no current flow is detected. In the case of an "erased" cell instead the threshold voltage thereof must be such as to guarantee the flow of current.

In order to have a proper operation and to assure reliability of the memory device in reading, it is necessary to pose limits to the memory cells' threshold voltage distribution; in particular, the distribution of the memory cells' threshold voltages must be comprised between approximately 0.5 V and 2.5 V. The lower limit is based on the simultaneous requirements of assuring that no "depleted" cells exist, i.e., cells having a threshold voltage lower than zero, and preventing damages to the thin limit stems from the intrinsic width of the distribution, generally a gaussian.

If the supply voltage is low, e.g., 2.5 V, all the erased memory cells with threshold voltages near the value of the supply voltage do not drain sufficient current, so that the reading thereof provides an incorrect result because the current flowing through the cell is too low and the cell is erroneously read as written.

Conventionally, this problem is solved by using boosting circuitries for the rows of the matrix, i.e., supplying the gate electrode of the cell to be read with a voltage higher than the supply voltage of the memory device. The boosted voltage is normally generated by means of a so-called "boost" capacitor that, after having been charged up to the supply voltage, is submitted at a first plate thereof to a voltage pulse equal to the supply voltage, so that at a second plate thereof a voltage higher than the supply voltage is obtained.

The voltage pulse is applied when it is necessary to access the memory cell.

The adoption of such a solution requires that the voltage boosting step starts together with the selection of the row, i.e., with the rise of the potential of the row to be accessed, corresponding to the node to be boosted, to values sufficiently near the supply voltage. To this purpose a dummy path is used simulating the real selection path of the row.

At the end of each read operation it is necessary to reset the initial conditions of the boosted nodes. In order to correctly carry out a successive access, it is in fact necessary that the nodes affected by boosting are at a correct voltage value, so that the desired boosted voltage value can be reached.

As mentioned, for a correct working of the boosting circuit the boost capacitor is charged up to the supply voltage of the memory device. For the principle of conservation of charge, when the plate of the capacitor which is at the lower potential is applied with the boosting pulse, the potential of the other plate is subjected to a corresponding increase of potential. The boosted voltage is the supply voltage of the driver circuits of the rows, so the boosted voltage is supplied to the row to be accessed and the information can be read by the sensing circuitry without the problems outlined above. Once the access to the memory cell has been performed, it is possible to come back to the rest conditions.

However, parasitic capacitances are connected to the plate of the boost capacitor which is boosted; thus, due to the presence of a capacitive partitioner formed by the boost capacitor and the parasitic capacitances, the charge stored in the boost capacitor is split between the boost capacitor and the parasitic capacitances, so that the voltage increase of the node to be boosted is lower than expected. When the initial conditions are re-established, i.e., when the voltage of the first plate of the boost capacitor is returned to ground, due to the charge conservation principle also the second plate of the boost capacitor undergoes the same voltage decrease. The boosted node thus takes a voltage value lower than that prior to the start of the boosting step (equal to the supply voltage), so that in order for that node to return to the initial value it is necessary to re-charge the boost capacitor. For boost capacitors of significant capacitances, typically 40–50 pF, the time required for the re-charge are approximately of 30–40 ns, unacceptable if compared to the average access times of non-volatile memories of about 100 ns.

The boost capacitor is normally re-charged by means of a P-channel transistor with source connected to the supply voltage; such a transistor operates with a small drain-to-source voltage difference, and thus it is not capable of furnishing high currents; even if a large transistor were employed, the recharge speed would not be significantly increased.

It is also clear that if a new read cycle were to start before the initial conditions on the boosted node are re-established, i.e., before the boost capacitor has been recharged, not only the voltage on the boosted node would not reach the desired voltage, but at the end of the boosting voltage pulse the voltage of the boosted node would be at an even lower value, until the voltage on the boosted node would no more be sufficient for assuring a correct reading.

SUMMARY OF THE INVENTION

Thus, in view of the state of the art described, it has been an object of the present invention of providing an improved boosting circuit, particularly for a memory device, allowing for resetting the initial conditions on the node to be boosted without having to wait for re-charge times not compatible with the access times of the memory devices.

According to the present invention, such an object is achieved by a boosting circuit supplied by a first voltage level and a second voltage level, and having an output line capable of taking a third voltage level. At least two distinct circuits are provided for generating the third voltage level, the two circuits can be selectively activated for generating the third voltage level and selectively coupleable to the output line.

BRIEF DESCRIPTION OF THE DRAWINGS

The features and advantages of the present invention will be made apparent by the following detailed description of one embodiment thereof, illustrated as a non-limiting example in the annexed drawings, wherein.

DETAILED DESCRIPTION OF THE INVENTION

Figure 1:
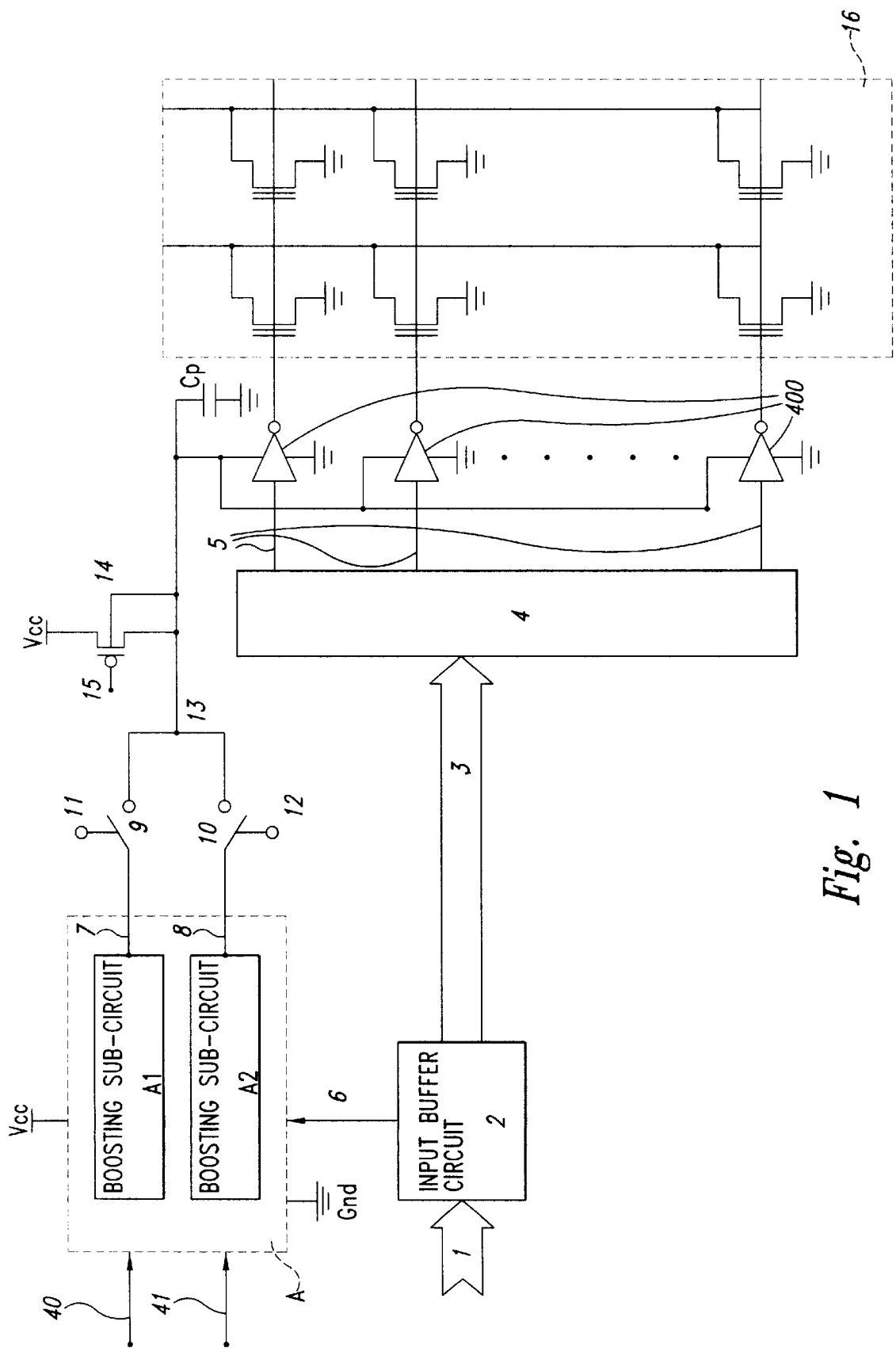
FIG. 1 schematically shows a boosting circuit according to the present invention, associated with a row decoding circuit of a memory device.

FIG. 1 schematically shows a matrix of memory cells 16 of a memory device, comprising rows and columns, and a row decoding and selection circuitry 4, 400. External address signals 1 supply an input buffer circuit 2 that provides internal address signals 3, and a read start signal 6 generally called "Address Transition Detected" (ATD) which is activated upon transition of state of the external address signals 1. The internal address signals 3 supply the row decoder circuit 4, which generates signals 5 that, through respective driving stages 400, allow for selecting each one of the rows of the memory cell matrix 16.

The row decoding and selection circuitry has associated therewith a boosting circuit A, composed by two sub-circuits A1 and A2 capable of generating on respective nodes 7 and 8 a boosted voltage of value higher than a voltage supply Vcc. Nodes 7 and 8 can be selectively coupled to a supply line 13 of the driving stages 400 through selection means 9 and 10 operated by respective control signals 11 and 12. To the supply line 13 is connected the drain of a pre-charge transistor 14 for the row decoding circuitry, transistor 14 having source connected to Vcc and being controlled by a control signal 15.

Figure 2:
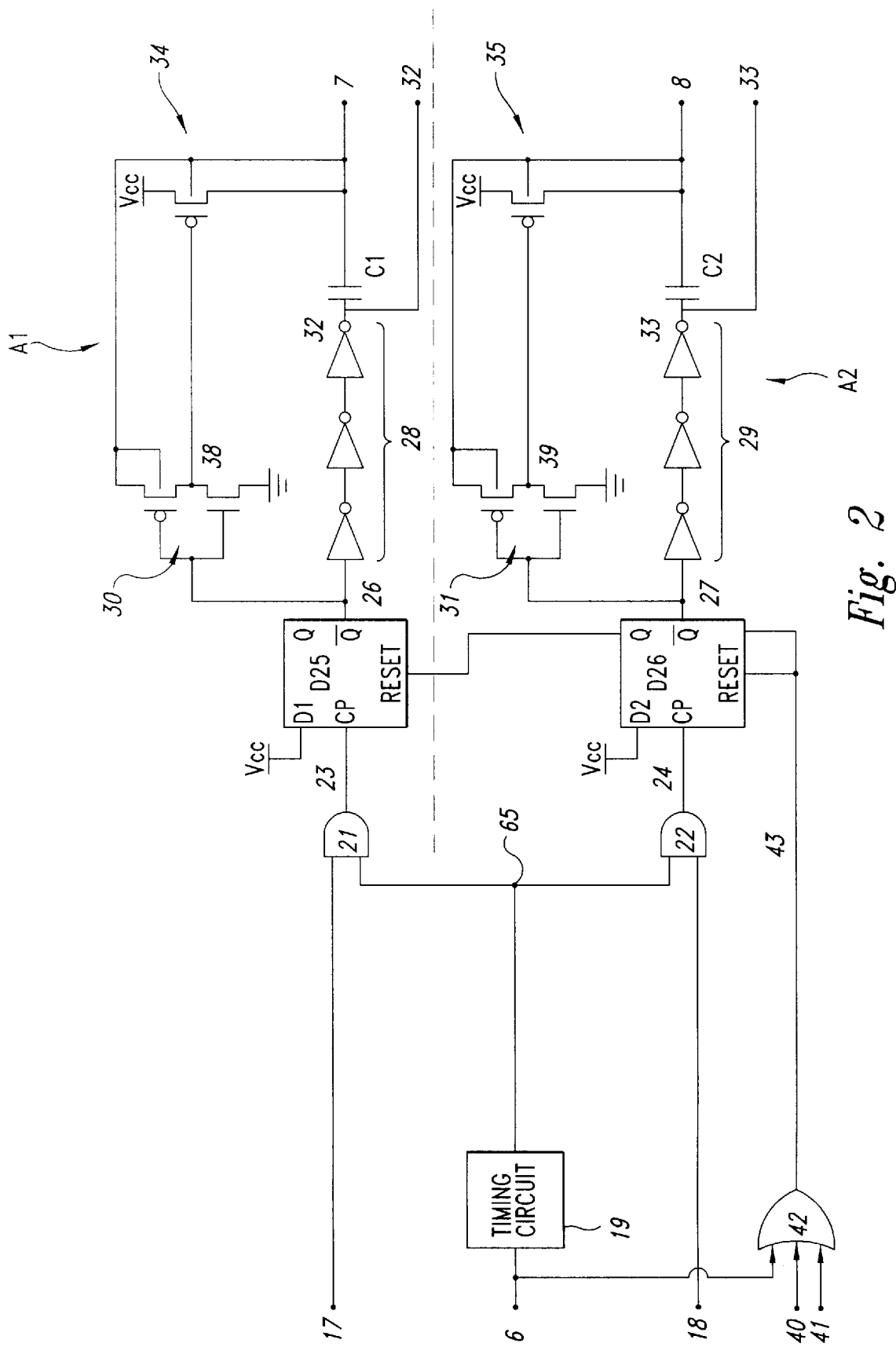
FIG. 2 shows in greater detail the boosting circuit of FIG. 1.

FIG. 2 shows a possible embodiment of circuit A, divided in the two sub-circuits A1 and A2, respectively, comprising boost capacitors C1 and C2. The address transition signal 6, through a timing circuitry 19 containing, among the others, a dummy path simulating the real row selection signal, causes activation of a signal 65.

Sub-circuit selection signals 17 and 18 supply, together with signal 65, AND gates 21 and 22 the outputs 23 and 24 thereof form the clock signal of D-type flip-flops D25 and D26, having respective inputs D1 and D2 supplied with the supply voltage Vcc. The reset of such flip-flops is commanded by a signal 43 coming from an OR gate 42 supplied in input with signal 6, a reset signal 40 of the whole memory device and a signal 41 detecting the end of a read operation, which is activated upon termination of the read by the sense amplifiers of the column decoding circuit.

Complemented output signals 26 and 27 of flip-flops D25 and D26 are supplied to respective inverter chains 28 and 29, the respective outputs 32 and 33 thereof drive a first plate of capacitors C1 and C2. Signals 26 and 27 also drive respective P-MOS transistors 34 and 35 for the pre-charge of the boosting circuit, transistors 34 and 35 being connected between Vcc and the second plate 7, 8 of C1 and C2, respectively, for pre-charging capacitors C1 and C2. Inverters 30 and 31 have as supply voltage the voltage of nodes 7 and 8, respectively.

Let's now examine the dynamic behavior of sub-circuit A1.

In rest conditions (e.g., once a reading operation has terminated or before the start of a new reading operation), signal 26 at the output of flip-flop 25 is at the high logic level. Consequently, nodes 32 and 38 are at the low logic level; transistor 34 conducts current and thus charges capacitor C1, until the voltage drop across capacitor C1 is equal to Vcc, when the potential difference between the source and drain electrodes of transistor 34 becomes zero.

When signal 23 (normally at the low logic level) goes high, signal 26 at the output of flip-flop D25 becomes a logic zero. Consequently, nodes 32 and 38 respectively goes to Vcc and to the potential of node 7; by conservation of charge in capacitor C1, node 7 goes to a potential equal to Vcc+V1, where V1 is the voltage increase of node 7 which is generally lower than Vcc due to the presence of parasitic capacitances of the circuit between node 7 and ground. Because the inverter 30 is supplied by the potential of node 7, and being the input signal 26 is at ground, the output 38 of inverter 30, and thus the gate electrode of transistor 34, is virtually short-circuited to ground; transistor 34 is thus turned off, and node 7 is left floating, so that C1 cannot discharge towards Vcc. Additionally, because the bulk electrodes of the N-channel transistor 34 and of the P-channel transistor of the inverter 30 are connected to node 7, which is at the highest potential, the biasing of the different junctions is correct.

As will be better described in the following, signal 26 at the output of flip-flop D25 comes back to the high level when, e.g., the reading has been completed, i.e., when signal 41 is activated. Nodes 32 and 38 come back to a zero voltage, while node 7 goes to a potential equal to V1; transistor 34 is turned on again and charges capacitor C1, until the drop across capacitor 1 is equal to Vcc, thus resetting the conditions previous to the boosting cycle.

A similar analysis can be carried on for sub-circuit A2.

AND gates 21 and 22 substantially allow propagation of signal 65 to one of the activation lines 23, 24 of sub-circuits A1 and A2; the reset of flip-flops D25 and D26 happens upon completion of a read cycle (activation of signal 41), or a variation of the external address signals, also before the completion of a read cycle in progress (activation of signal 6), and also whenever the whole memory device is reset (signal 40). This guarantees that the boosting circuitry is always ready at each variation of the external address signals which is detected by signal 6, thus resetting the correct initial conditions if such a variation of the address signals happens during a read cycle still in progress.

Figure 3:
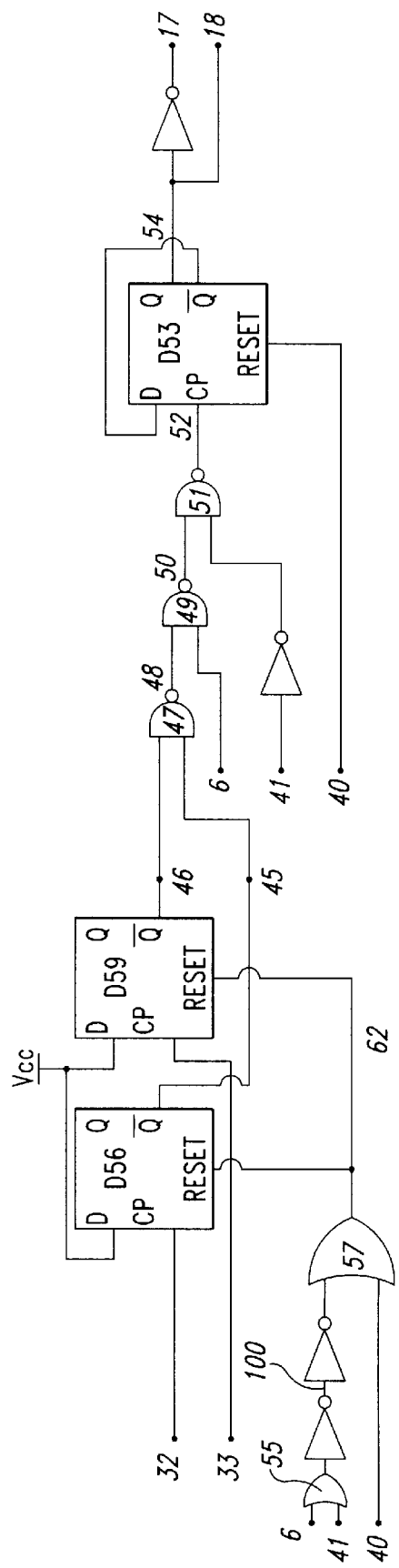
FIG. 3 shows the circuitry allowing for the choice between two alternative paths of the boosting circuits according to the invention.

FIG. 3 shows a possible implementation of the circuitry generating the enable signals 17 and 18 of one or the other, alternatively, of the sub-circuits A1 and A2.

It is to be noted that, starting from a situation in which signal 17 is at the high logic level, a transition of signal 6, and thus of signal 65, causes the activation of signal 23, and thus boosting of node 7.

Activation of signal 6 causes the switching of a toggle flip-flop D53 whose output 54 generates the two complementary signals 17 and 18. In this way the other sub-circuit A2 is enabled; sub-circuit A2 will provide on node 8 the boosted voltage upon a successive transition of signal 6 starting a new read cycle.

A transition of signal 6 must however be treated by the circuit of FIG. 2 differently if such a transition takes place when a reading cycle has been completed, or during a reading operation, or at the beginning of a read cycle, when neither of nodes 7 or 8 has already been boosted. Let's suppose that sub-circuit A1 is enabled by means of signal 17: if a transition of signal 6 takes place after that node 7 has been boosted, then it is necessary to enable the other sub-circuit; if differently such a transition precedes the boosting pulse of node 7, then it is not necessary to change the sub-circuit because the corresponding boost capacitor must not be re-charged.

The information on the already happened start of the boosting can be taken from signals 32 and 33 at the output of flip-flops D25 and D26, which are switched high in correspondence of a boosting pulse on the respective line.

The possible change of path must thus be performed, for each sub-circuit, only if the following expression is true: {(41) OR ([(6) AND (32)]}, for sub-circuit A2; {(41) OR [(6) AND (33)]} for sub-circuit A2. The logic AND in the preceding expressions stems from the necessity of having a change in the boosting path only if a boosting pulse has already taken place, thus blocking the propagation of signal 6 in the circuit of FIG. 3 by means of signals 32 and 33, respectively.

The previous functional requirements lead to the structure shown in FIG. 3, wherein 45 and 46 are the signals 32 and 33 properly prolonged beyond the duration of the boosting pulse, so as to take memory of which of capacitors C1 or C2 has been submitted to the boosting pulse.

Signals 45 and 46 supply a NAND logic gate 47 whose output 48 drives, together with the address transition signal 6, another NAND gate 49. An output signal 50 of gate 49 supplies, together with the logic complement of signal 41, another NAND gate 51 whose output 52 forms the clock signal for flip-flop D53. The reset of such a flip-flop is controlled by signal 40, which is the reset signal of the whole memory device.

Signals 32 and 33 form the clock signals for D-type flip-flops D56 and D59, whose inputs are connected to voltage Vcc. The complemented outputs of said flip-flops form signals 45 and 46. Said flip-flops are simultaneously reset by a signal 62 which is obtained starting from signals 6 and 41, that are supplied to an OR gate 55. The output of OR gate 55 supplies, through a delay chain 100 and together with the device reset signal 40, an OR gate 57 whose output forms signal 62.

Let's now examine the behaviors of the system in a typical read cycle.

The address transition signal 6 is normally at the low logic level. Upon transition of state of one or more of the address signals 1, the signal 6 is activated (high logic level) for a prescribed time interval. This causes, after a proper time interval, the activation of signal 65 which is normally at the low logic level and which goes to the high level.

At the memory device power up, the reset signal 40 is activated (high logic level) and causes the reset of flip-flops D25, D26, D56, D59 and D53. Signal 17 (FIG. 3) is thus brought to the high logic level, enabling through AND gate 21 the sub-circuit A1 (FIG. 2). Signal 18 is instead brought to the low logic level so as to disable through gate 22 the sub-circuit A2. Nodes 32 and 33 are brought to the low logic level, so at ground, and these initial conditions are the correct ones for a successive boosting pulse. Signals 45 and 46 are brought to the high logic level, so signal 48 is brought to the low logic level (FIG. 3).

Upon activation of signal 6 flip-flops D25 and D26 are immediately activated, and signals 32 and 33 are brought to ground. Activation of signal 6 causes, through circuit 19, the activation of signal 65, that originates a rising edge of signal 23 activating flip-flop D25. Node 32 goes to Vcc, thus causing a boosting pulse on capacitor C1 and the transition of the potential of node 7 from Vcc to Vcc+V 1.

The transition of signal 32 to the high level causes signal 45 to switch to the low logic level (FIG. 3), so signal 48 rises to the high logic level, so that a possible activation of signal 6 causes, through signal 50 and 52, activation of signal 18 and thus enabling of sub-circuit A2 (FIG. 3). Such a behavior stems from the necessity of enabling one or the other boosting chain if a new reading operation starts while a previously started read cycle is still in progress, and the boost capacitor of the boosting chain previously enabled has not yet been recharged to Vcc. It is in fact necessary to note that at each activation of signal 6 flip-flops D25 and D26 are immediately reset, so that nodes 32 and 33 are brought to the low logic level. The potential of node 7 is thus brought to V1<Vcc, thus initial conditions are reset only after C1 has recharged through transistor 34.

Flip-flops D56 and D59 are instead not immediately reset at the activation of signal 6, due to the presence of the delay chain 100. Flip-flops D56 and D59 keep memory of which boosting path had been enabled, depending on the state of signals 32 and 33. This information, through signals 45 and 46, allows to select a different boosting path for the new reading operation. Only after the selection of the new boosting path through signals 17 and 18 are flip-flops D56 and D59 reset.

If differently signal 6 is activated when a boosting phase is not already started, since nodes 32 and 33 are both at ground (low logic level), signal 48 is at the low logic level and thus signal 6 does not pass through gate 49; signal 52 remains at the low logic level and does not act on flip-flop D53. In this case it is not necessary to select the other boosting circuit, because both C1 and C2 are still charged at Vcc.

At the end of the reading operation signal 41 is activated, and resets flip-flops D25 and D26; the potential of nodes 32 and 33 is thus reset to ground (FIG. 2). This also causes the activation of signal 52 (FIG. 3), that causes D53 to switch and thus the enabling of the other boosting sub-circuit (signal 18 goes to the high logic level) for the next read cycle, so that capacitor C1 can re-charge.

A totally similar behavior takes place when sub-circuit A2 is initially enabled, with signal 18 at the high logic level.

Preferably, the timing of circuit 19 that activates signal 65 starts on the falling edge of signal 6; this prevents timing problems due to the fact that signal 6 also causes, at its rising edge, the reset of flip-flops D25, D26 and D56, D59. However, such a timing could also start on the rising edge of signal 6, making in this case more attention for avoiding the above-referred timing problems.

The use of two boosting circuits operating alternatively from one another requires that a suitable circuitry is developed for properly connecting the two paths to the node to be boosted. In FIG. 1 such a circuitry is schematically indicated by means of switches 9 and 10, controlled by signals 11 and 12. It is evident that, in the case of a boosting pulse generated by sub-circuit A1, switch 9 is to be closed and switch 10 open, so as to assure an optimal transfer and without losses of the boosting pulse.

Such switches can be realized by means of P-channel MOS transistors, with pass functions, and in this case it is necessary a boosting action of the control signals thereof, so as to guarantee a correct turning off. Considering in fact a read cycle with boosting operated by sub-circuit A1, node 11, i.e., the gate electrode of the P-channel transistor forming switch 9, must be kept to ground so that node 13 can be brought to the potential of node 7, while node 12, i.e., the gate electrode of the P-channel transistor forming switch 10, must be kept at a potential at least equal to the potential of node 13. Thus, node 12 must be boosted too, and submitted to this boosting action previously than the nodes of the row decoding, so as to prevent losses due to undesired shorts of the circuits in sub-circuit A2. However, the switches could as well be formed by means of N-channel MOS transistors.

It is also necessary that the N type semiconductor well of a P-channel MOS transistor is always connected to the highest potential, so as to prevent forward biasing of the respective source and drain/well junctions; thus, the potential of the N type well must be boosted during reading.

The use of a structure based on two boosting lines according to the invention also requires a layout suitable for not reducing the efficiency of the boosting action and for not increasing the area of the chip.

The main cause of boosting efficiency losses is represented by parasitic capacitances, indicated by Cp in FIG. 1. Such capacitances are substantially formed by capacitances associated to the source regions of the P-channel MOS transistors used for the row decoding (final stages 400), capacitances of the N type wells within which such transistors are formed, coupling capacitances between the metal lines and all the other layers and between other metal lines. It is thus important that the parasitic capacitances Cp are not further increased by, e.g., the capacitance of the connection line between node 7 and node 13.

Figure 4:
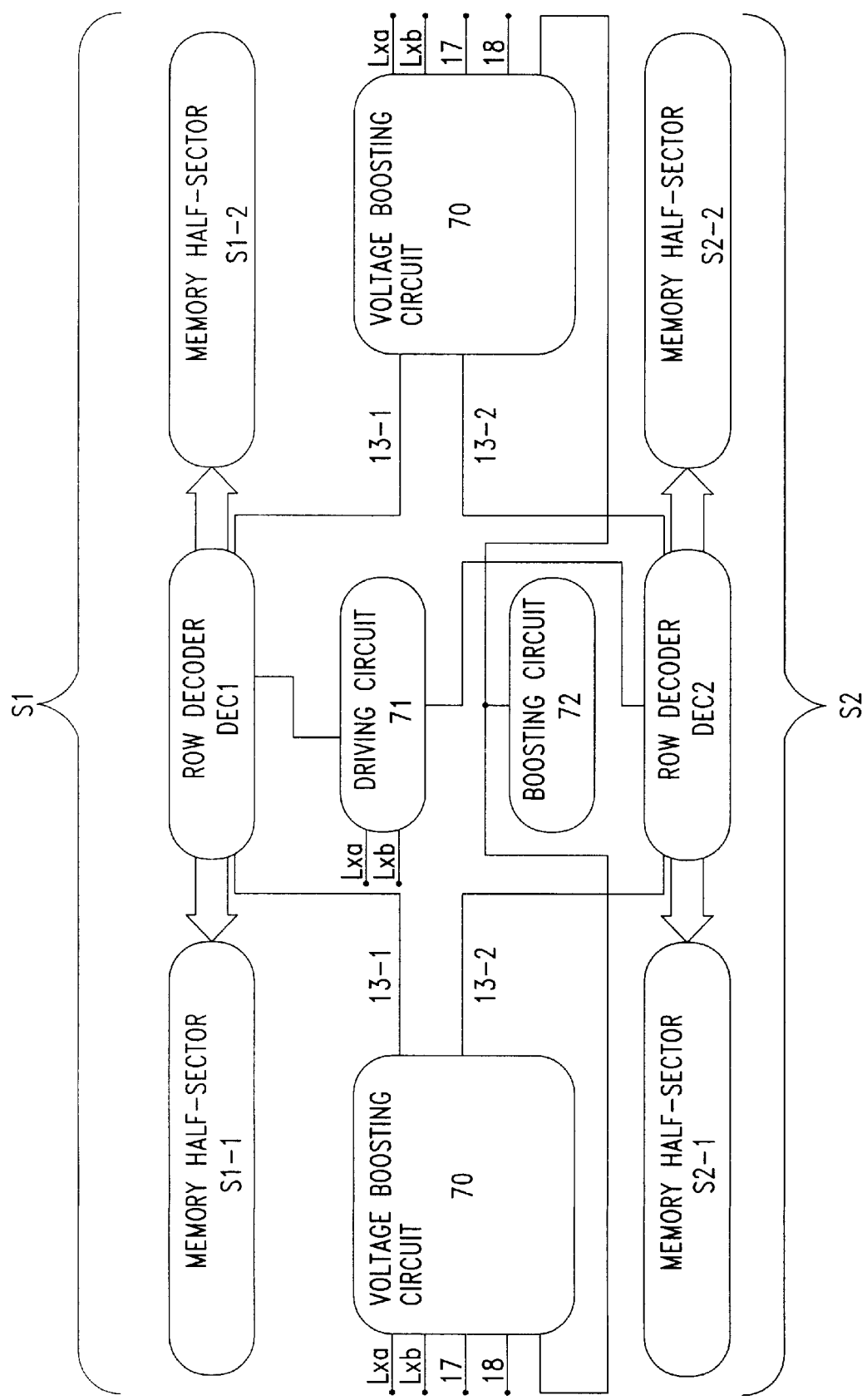
FIG. 4 shows a possible implementation of the boosting circuit according to the invention in a sectorized memory device.

Usually, in sectorized non-volatile memory devices, to each sector there is associated a respective boosting circuit. A possible implementation of the present invention could thus provide for doubling the number of capacitors, with a consequent substantial increase of the silicon area. FIG. 4 schematically shows how its is possible to implement the present invention in a sectorized memory device without increasing the area.

S1_1, S1_2 are two half-sectors of a sector S1, S2_1 and S2_2 are two half-sectors of a sector S2. Blocks 70 represent functional blocks each comprising the boosting sub-circuits A1, A2 with the respective boost capacitors C1, C2, switches 9, 10 etc. The output line 13 of the boosting circuit of FIG. 1 is selectively coupleable to one of two output lines 13_1, 13_2 for respective row decoding circuitries DEC1, DEC2 of the sectors S1, S2.

Blocks 71 and 72 are common to both the half-sectors and occupy the 25 area between the row decoding circuitries DEC1, DEC2 of the two successive sectors S1, S2.

Block 71 contains the driving circuitry of the P-channel transistors 14 for the pre-charge of the row decoding circuitries DEC1, DEC2. The choice of the sector is made by means of signals Lxa, Lxb, These signals also supply blocks 70 for selecting one of the lines 13_1 and 13_2.

Block 72 contains the circuitry necessary for boosting the N type wells wherein the P-channel MOSFETs forming switches 9, 10 are obtained.

Each one of blocks 70 is thus associated to two half-sectors, so that the space occupied by the final layout is equal to that obtained in the case of conventional circuitries having a single boosting line.

What is claimed is:

1. A memory device voltage booster supplied by a first voltage level and a second voltage level, comprising at least two distinct read voltage booster circuits for generating a predetermined voltage level, a control circuit for selectively activating the at least two distinct booster circuits to generate said predetermined voltage level and for selectively coupling only one of said at least two distinct read voltage booster circuits at a time to an output line coupled to a memory device driving stage.

2. The memory device voltage booster of claim 1 wherein each of said at least two distinct read voltage booster circuits comprises capacitive means having a first plate coupleable, by means of switching means, to said output line, and a second plate driven by driving circuit means suitable for bringing the second plate from said second voltage level to said first voltage level in response to a read start signal of a boosting operation, said driving circuit means being selectively enabled.

3. A circuit for a memory device, the circuit comprising a read voltage boosting circuit supplied by a first voltage level and a second voltage level and having an output line coupled to a memory device driving stage and suitable for taking a third voltage level, the boosting circuit comprising at least two distinct identical booster circuits for generating said third voltage level, each booster circuit selectively activatable for generating said third voltage level; and a control circuit for selectively coupling to said output line only one of said booster circuits at a time that is capable of generating said third voltage level.

4. The circuit of claim 3 wherein each of said at least two distinct booster circuits comprises capacitive means having a first plate coupleable, through switching means, to said output line, and a second plate driven by driving circuit means adapted to bring the second plate from said second voltage level to said first voltage level in response to a read start signal of a boosting operation, said driving circuit means being selectively enabled.

5. The circuit of claim 4, further comprising an array of memory elements, and selection means for selecting the memory elements in response to address signals, said output voltage line forming a supply line for the driving stage coupled to said selection means.

6. The circuit of claim 5 wherein said read start signal of a boosting operation is a start signal of a read cycle of the memory that is activated upon change of state of said address signals.

7. The circuit of claim 6 wherein said control circuit comprises circuit means for selecting the booster circuit for generating the third voltage level, said circuit means configured to couple to said output line a different booster circuit at each read cycle of the memory.

8. The circuit of claim 7 wherein said control circuit is configured to selectively actuate a selected booster circuit in response to the read start signal by enabling the driving circuit means.

9. The circuit of claim 8 wherein said driving circuit means comprises flip-flop means activatable for bringing the second plate of said capacitive means from the second voltage level to the first voltage level in response to said read start signal only when a respective selection signal is activated generated by the control circuit.

10. A voltage boosting circuit for supplying a boosted voltage to a memory device having a plurality of memory elements and a memory address decoding circuit for sending signals to selected memory elements in response to address signals, the voltage boosting circuit comprising:

a first read voltage booster circuit for supplying the boosted voltage to the memory address decoding circuit;

a second read voltage booster circuit for supplying the boosted voltage to the memory address decoding circuit;

a coupling circuit for selectively coupling only one of the first and second booster circuits to the memory address decoding circuit at a time in response to a control signal; and an enabling circuit for selectively enabling the first and second booster circuits in response to a selection signal.

11. The circuit of claim 10 wherein each of the first and booster second circuits comprises an output line and a capacitive element coupled to the output line, and wherein the coupling circuit comprises a switch for each capacitive element to selectively couple the capacitive element to the output line.

12. The circuit of claim 11 wherein the enabling circuit is configured to selectively enable the capacitive element in the first and second circuits in response to a transition of the state of the address signals.

13. The circuit of claim 12 wherein the enabling circuit is configured to respond to a positive edge transition of the state of the address signals.

14. The circuit of claim 12 wherein the enabling circuit includes a selection circuit for generating the selection signal for selecting the first and second circuits; and a memory circuit for storing the selection signal.

15. The circuit of claim 14 wherein the enabling circuit further includes a reset circuit for resetting the memory circuit, and a delay circuit for delaying the reset circuit for a predetermined period of time.

16. The circuit of claim 14, further comprising first and second charging circuits for the first and second booster circuits, respectively, to charge the capacitive elements, and further wherein the selection circuit is configured to couple the capacitive elements to their respective charging circuits in response to the selection signal.

17. The circuit of claim 16 wherein the selection circuit is configured to select a different one of the booster circuits from the first and second booster circuits in response to each change in the state of the address signal.

18. The circuit of claim 16 wherein the coupling circuit comprises a first switch connected to the first circuit and a second switch connected to the second circuit, and a control circuit configured to generate the control signal for controlling operation of the first and second switches.

19. A circuit for a memory device, the circuit comprising:
a read voltage boosting circuit supplied by a first voltage level and a second voltage level and having an output line suitable for taking a third voltage level, the boosting circuit comprising at least two distinct identical booster circuits for generating the third voltage level, each booster circuit selectively activatable for generating the third voltage level, each of the at least two distinct booster circuits comprising capacitive means having a first plate couplable, through switching means, to the output line, and a second plate driven by driving circuit means adapted to bring the second plate from the second voltage level to the first voltage level in response to a read start signal of a boosting operation, the read start signal comprising a start signal of a read cycle that is activated upon change of state of address signals for a memory comprising an array of memory elements and selection means for selecting the memory elements in response to address signals, the output voltage line forming a supply line for a driving stage coupled to the selection means, and wherein the driving circuit means is selectively enabled; and a control circuit for selectively coupling one of the booster circuits at a time to the output line, the control circuit comprising circuit means for selecting the booster circuit for generating the third voltage level, the control circuit means configured to couple to the output line a different booster circuit at each read cycle of the memory.

20. The circuit of claim 19 wherein the control circuit is configured to selectively activate a selected booster circuit by enabling the driving circuit means.

21. The circuit of claim 20 wherein the driving circuit means comprises flip-flop means activatable for bringing the second plate of the capacitive means from the second voltage level to the first voltage level in response to the read start signal only when a respective selection signal is generated by the selection means.

22. A voltage boosting circuit for supplying a boosted voltage to a memory device having a plurality of memory elements and a memory address decoding circuit for sending circuits to selected memory elements in response to address signals, the voltage boosting circuit comprising:
a first read voltage booster circuit for supplying 1a boosted read voltage to the memory address decoding circuit and a second read voltage booster circuit for supplying a boosted read voltage to the memory address decoding circuit, each of the first and second read voltage booster circuits comprising an output line and a capacitive element coupled to the output line;
a coupling circuit for selectively coupling only one of the first and second read voltage booster circuits to the memory address decoding circuit at a time and in response to a control signal, the coupling circuit comprising a switch for each capacitive element to selectively couple the capacitive element to the output line only when the capacitive element is charged; and
an enabling circuit for selectively enabling the first and second read voltage booster circuits in response to a selection signal, the enabling circuit configured to selectively enable the capacitive element in the first and second read voltage booster circuits in response to a positive edge transition of the state of the address signals, the enabling circuit including a selection circuit for generating the selection signal for selecting the first and second read voltage booster circuits, and a memory circuit for storing the selection signal.

23. The circuit of claim 22 wherein the enabling circuit further includes a reset circuit for resetting the memory circuit, and a delay circuit for delaying the reset circuit for a predetermined period of time.

24. The circuit of claim 23, further comprising first and second charging circuits for the first and second booster circuits, respectively, to charge the capacitive elements, and further wherein the selection circuit is configured to couple the capacitive elements to their respective charging circuits in response to the selection signal.

25. The circuit of claim 24 wherein the s election circuit is configured to select a different one of the booster circuits from the first and second booster circuits in response to each change in the state of the address signal.

26. The circuit of claim 25 wherein the coupling circuit comprises a first switch connected to the first booster circuit and a second switch connected to the second booster circuit, and a control circuit configured to generate the control signal for controlling operation of the first and second switches.

* * * * *

UNITED STATES PATENT AND TRADEMARK OFFICE
CERTIFICATE OF CORRECTION

PATENT NO. : 6,144,589
DATED : November 7, 2000
INVENTOR(S) : Rino Micheloni et al.

It is certified that error appears in the above-identified patent and that said Letters Patent is hereby corrected as shown below:

Title page,
Item [30], the foreign priority application number should read -- 97830572.0 --.

Signed and Sealed this

Sixth Day of November, 2001

Attest:

NICHOLAS P. GODICI
Attesting Officer    Acting Director of the United States Patent and Trademark Office